US009378089B2

(12) United States Patent
Nakagawa

(10) Patent No.: US 9,378,089 B2
(45) Date of Patent: Jun. 28, 2016

(54) SEMICONDUCTOR STORING DEVICE AND REDUNDANCY METHOD THEREOF

(71) Applicant: Winbond Electronics Corp., Taichung (TW)

(72) Inventor: Harunobu Nakagawa, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 126 days.

(21) Appl. No.: 14/453,606

(22) Filed: Aug. 6, 2014

(65) Prior Publication Data

US 2015/0121174 A1 Apr. 30, 2015

(30) Foreign Application Priority Data

Oct. 24, 2013 (JP) ................. 2013-220913

(51) Int. Cl.
*G06F 11/10* (2006.01)
*G11C 29/44* (2006.01)
*G11C 29/42* (2006.01)
*G11C 29/12* (2006.01)

(52) U.S. Cl.
CPC .......... *G06F 11/1048* (2013.01); *G11C 29/44* (2013.01); *G11C 29/4401* (2013.01); *G11C 29/42* (2013.01); *G11C 2029/1208* (2013.01)

(58) Field of Classification Search
CPC .............. G11C 29/4401; G11C 29/44; G11C 2029/0401; G11C 29/76; G11C 2029/0409; G11C 2029/0411; G11C 2229/723; G11C 2029/1208; G11C 29/42
USPC ........................................... 714/710
See application file for complete search history.

(56) References Cited

U.S. PATENT DOCUMENTS

| 7,047,455 B2 * | 5/2006 | Roohparvar | ........... G11C 29/82 714/710 |
| 7,073,101 B2 * | 7/2006 | Lee | ........... G11C 29/10 714/718 |
| 7,085,971 B2 * | 8/2006 | Barth, Jr. | ........... G11C 29/42 365/200 |

(Continued)

FOREIGN PATENT DOCUMENTS

EP 1912121 4/2008
JP 2000311496 11/2000

(Continued)

OTHER PUBLICATIONS

"Office Action of Taiwan Counterpart Application", issued on Oct. 19, 2015, p. 1-p. 7.

(Continued)

*Primary Examiner* — James C Kerveros
(74) *Attorney, Agent, or Firm* — Jianq Chyun IP Office

(57) ABSTRACT

A semiconductor storing device and a redundancy method thereof are provided. The semiconductor storing device is for example a NAND flash memory, which includes: a storing array including a storing area and a redundancy storing area with a redundancy element; a page buffer; a row selecting circuit; an ECC circuit; and an I/O buffer. The row selecting circuit transforms defect data included in core data retained by a cache register into redundancy data retained by a redundancy cache register, and provides the transformed data to the ECC circuit, and the data corrected by the ECC circuit as the core data is written to the cache register again. During this period, the row selecting circuit outputs the corrected data retained in the cache register to the I/O buffer.

9 Claims, 9 Drawing Sheets

(56) References Cited

U.S. PATENT DOCUMENTS

| | | | |
|---|---|---|---|
| 7,092,289 B1 * | 8/2006 | Wong | G11C 5/025 365/185.09 |
| 7,219,271 B2 | 5/2007 | Kleveland et al. | |
| 7,239,547 B2 | 7/2007 | Suda | |
| 7,328,384 B1 * | 2/2008 | Kulkarni | G01R 31/318519 714/725 |
| 7,401,270 B2 * | 7/2008 | Hummler | G11C 29/44 714/710 |
| 7,512,864 B2 | 3/2009 | Zeevi | |
| 8,122,303 B2 | 2/2012 | Ni et al. | |
| 8,276,032 B2 * | 9/2012 | Henry | G06F 11/2236 714/732 |
| 8,327,224 B2 | 12/2012 | Larsen et al. | |
| 2002/0157048 A1 * | 10/2002 | Roohparvar | G11C 29/82 714/723 |
| 2006/0184856 A1 * | 8/2006 | Suzuki | G06F 11/1044 714/758 |
| 2007/0033449 A1 * | 2/2007 | Hwang | G11C 29/02 714/710 |
| 2007/0268905 A1 | 11/2007 | Baker et al. | |
| 2008/0065937 A1 * | 3/2008 | Micheloni | G06F 11/1068 714/711 |
| 2013/0191705 A1 * | 7/2013 | Watanabe | G06F 11/1056 714/773 |
| 2013/0336060 A1 | 12/2013 | Arakawa | |

FOREIGN PATENT DOCUMENTS

| | | |
|---|---|---|
| JP | 2002288993 | 10/2002 |
| JP | 2011238261 | 11/2011 |
| KR | 20110074644 | 7/2011 |
| KR | 20120005906 | 1/2012 |
| TW | 594776 | 6/2004 |
| TW | I262508 | 9/2006 |

OTHER PUBLICATIONS

"Office Action of Korean Counterpart Application", issued on Jul. 21, 2015, with English translation thereof, p. 1-p. 7.

* cited by examiner

| Defect Element | | Redundancy Element |
|---|---|---|
| Memory Block | Row Address | Row Address |
| Block (0) | MMAD5 | MRAD1 |
| Block (1) | MMAD2 | MRAD2 |
| . . . | . . . | . . . |
| Block (m-1) | MMAD21 | MRAD5 |

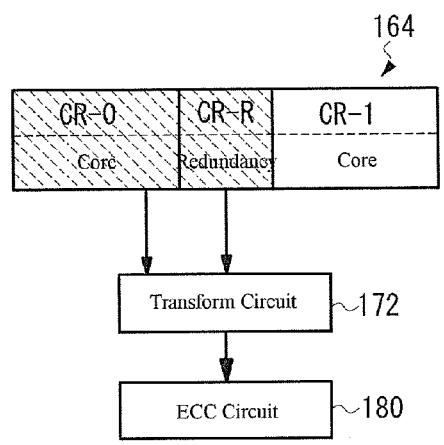
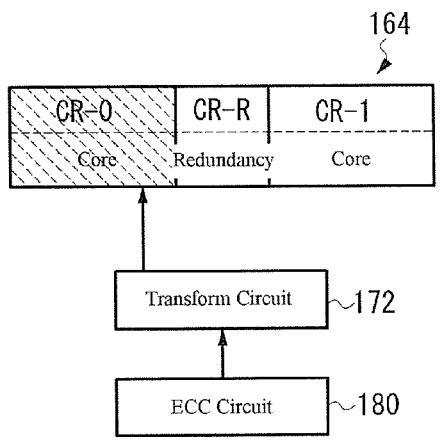
FIG. 7(A)   FIG. 7(B)
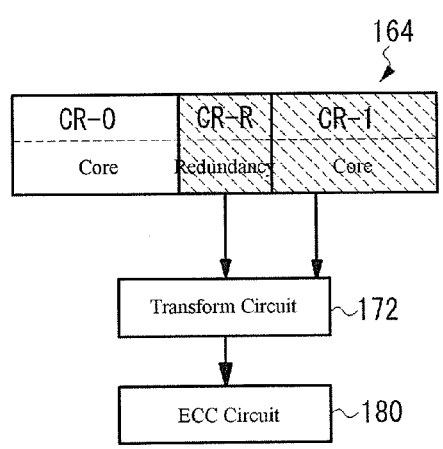
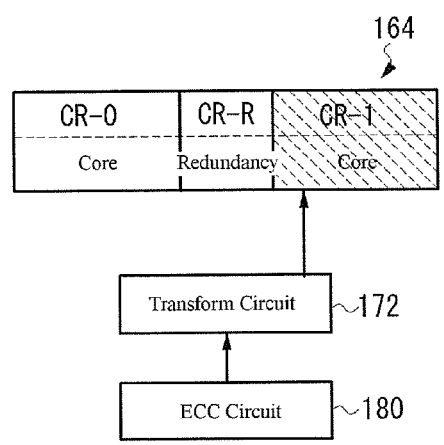
FIG. 7(C)   FIG. 7(D)

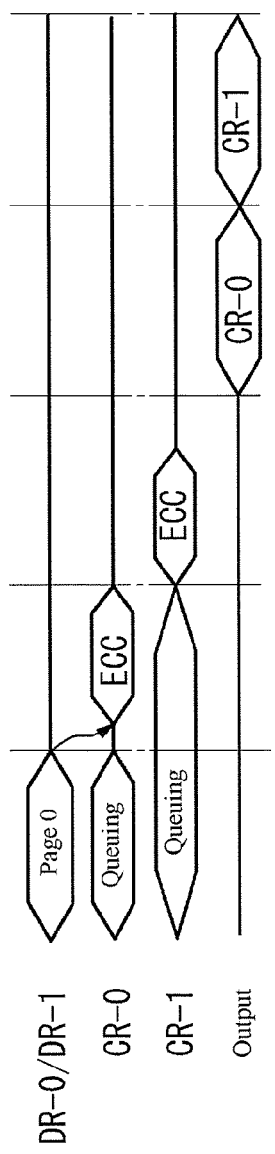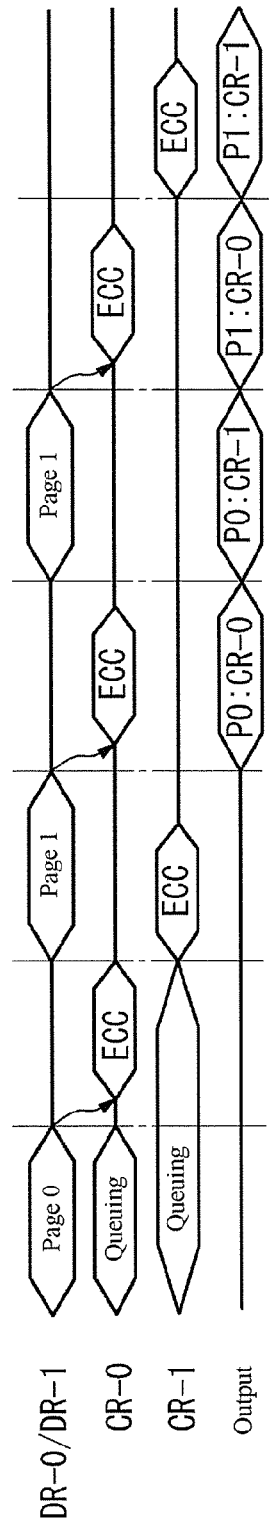
FIG. 9(A)
FIG. 9(B)

SEMICONDUCTOR STORING DEVICE AND REDUNDANCY METHOD THEREOF

CROSS-REFERENCE TO RELATED APPLICATION

This application claims the priority benefit of Japan application serial no. 2013-220913, filed on Oct. 24, 2013. The entirety of the above-mentioned patent application is hereby incorporated by reference herein and made a part of this specification.

BACKGROUND OF THE INVENTION

1. Field of the Invention

The invention generally relates to a semiconductor storing device, and more particularly to a redundancy of a NAND Flash Memory.

2. Description of Related Art

In semiconductor memories such as NAND flash memory, dynamic random access memory or the likes, the integrity thereof increases year by year. As a result, it is difficult to manufacture storing elements without flaws and defects. Therefore, a redundancy method which compensates the physical defects in appearance of the storing elements generated during manufacturing process has been adapted on a storing chip. For example, in some redundancy methods, an address conversion circuit and a redundancy memory area are included. The address conversion circuit converts the address of the storing elements having physical defects to an address of the storing elements of a redundancy storing area, and the redundancy storing area is configured to compensate for the storing elements having defects. The address information of the storing elements having defects and the storing elements of the redundancy storing area are stored in fuse read only memory, register, or the like during memory chip testing or at the completion of the fabrication. In addition, if the address of the storing elements having defects is being inputted and the address is being detected, the storing elements having defects would be forbidden to access. Instead, the storing elements of the redundancy storing area is being accessed such that it appears to be a storing elements without any defects from the appearance (for example, patent documents 1 and 2). By such redundancy method, even if a small amount of storing elements yield defects, they can still be treated as qualified product. As such, the yield can be increased while the manufacturing cost of the memory can be reduced.

Furthermore, in semiconductor memories, other than utilizing redundancy to compensate for physical defect elements, an error detection and correction circuit has been disposed internally as well to serve as a soft error countermeasures, thereby increasing the reliability.

[Patent Document 1] Japanese Patent No. 2000-311496
[Patent Document 2] Japanese Patent No. 2002-288993

Accordingly, the storing elements having redundancy function or an ECC circuit are being equipped in the semiconductor memories such as NAND flash memory or the like to compensate for the defects in storing elements. FIG. 1 is a schematic diagram illustrating the redundancy of the flash memory and error correction. A main storing area MM and a redundancy storing area MR thereof are configured in a storing array 400 of the NAND flash memory. If a page is being read from the storing array 400, a page of data would be transmitted to a page buffer/sensing circuit 410. The data would be sensed by the sensing circuit, and the data sensed would be retained in a data register 412.

A page of the main storing area MM and the redundancy storing area MR is, for example, 2000 bytes. While reading the page, for example, a half (i.e. 1000 bytes) of the even bit data is transmitted to a data register DR-0, and the remaining half (i.e. 1000 bytes) of the odd bit data is transmitted to a data register DR-1. Alternatively, the data located physically on the left of the main storing area MM is transmitted to the data register DR-0, and the data located on the right is transmitted to data register DR-1.

Herein, in the present specification, the storing elements having physical defects is called "defect elements," the data stored in the defect elements are called "defect data," the row bits of the defect element is called "defect bits," the storing elements of the redundancy storing area is called "redundancy element," the data stored in the redundancy element is called "redundancy data," and the row bits of the redundancy element is called "redundancy bits." In addition, the storing elements are synonymous with memory cell.

The redundancy storing area MR is, for example, M bits, and the redundancy storing area MR is constituted by allocating half of the bits (i.e. M/2 bits) to the data register DR-0 and M/2 bits to the data register DR-1. For example, the even redundancy bit data of the redundancy storing area MR is transmitted to the data register DR-0, and the odd redundancy bit data is transmitted to the data register DR-1.

The page buffer 410 also includes a cache register 414 which retains the data parallel transmitted from the data register 412. The cache register 414 includes cache registers CR-0 and CR-1. The cache register CR-0 receives data transmitted from the data register DR-0 through a transmission transistor (not illustrated). The cache register CR-1 also retain the data transmitted from the data register DR-1. The data retained in the cache register CR-0 includes the data coming from the main storing area MM (hereinafter core data) and the redundancy data coming from the redundancy storing area MR. The data retained in the cache register CR-1 also includes the core data and the redundancy data.

A row selecting circuit 420 includes transform circuits 422-0 and 422-1 adapted for replacing the core data retaining in the cache registers CR-0 and CR-1 with the redundancy data. The data retained in the cache registers CR-0 and CR-1 is being corrected or inputted/outputted is done by transmitting the data to the transform circuits 422-0 and 422-1 through the transmission transistor (not illustrated).

Redundancy data such as the row address of the defect bits or the row address of the redundancy bits which replaces the row address of the defect bits are stored by fuse ROM or other nonvolatile media. The transform circuit 422-0 transforms the defect data included in the core data of the cache register CR-0 into the redundancy data according to redundancy information. Similarly, the transform circuit 422-1 transforms the defect data included in the core data of the cache register CR-1 into the redundancy data.

The data transformed by the transform circuits 422-0 and 422-1 is outputted to an ECC circuit 430. The data corrected by the ECC circuit 430 is recovered as the core data and the redundancy data through the transform circuits 422-0 and 422-1. The corrected core and redundancy data are respectively written back to the cache registers CR-0 and CR-1.

The corrected core and redundancy data retained in the cache registers CR-0 and CR-1 are outputted to an I/O buffer 440 after transformed by the transform circuits 422-0 and 422-1. The operation of the cache registers CR-0, CR-1, the ECC circuit 430, and the I/O buffer 440 are performed alternately by the following method. During a period in which the corrected data of the cache register CR-0 is outputted to the I/O buffer 440, the ECC circuit 430 is utilized to correct the error in the data of the cache register CR-1. During a period in which the corrected data of the cache register CR-1 is outputted to the I/O buffer 440, the ECC circuit 430 is utilized to correct the error in the data of the cache register CR-0.

In the foregoing redundancy method, since halves of the redundancy storing area MR are equally allocated such that half of the redundancy bits is allocated for ½ page of core data, even assuming the total defect bits in one page is less or equal to M bits, the defect bits cannot be compensated under the circumstances such that the defect bits exist in ½ page of core data is over M/2 bits. For example, defects in metal contact usually occurs in local regions, and as a result, sometimes the core data of one of the data registers DR-0 would include more defect bits while another data register DR-1 does not include defect bits. Therefore, when evenly allocate the redundancy bits of the redundancy storing area MR to ½ page of core data, the efficiency of the compensation using redundancy data would decrease, thereby fail to increase the yield rate of the chips.

Furthermore, the data corrected by the ECC circuit 430 is re-written to the cache registers CR-0, CR-1 through the row selecting circuit 420, and when the data is being outputted to the I/O buffer 440, the defect bits of the core data are transformed into the redundancy bits through the transform circuits 422-0 and 422-1 again. Therefore, when the cache registers CR-0 and CR-1 are outputting data, it is necessary to pass the transform circuits 422-0 and 422-1. As a result, the cache operation speed is hindered.

SUMMARY OF THE INVENTION

The goal of the invention is to solve the current problem and provide a semiconductor storing device and redundancy method thereof, which can increase the yield rate and allow high speed reading of data.

The semiconductor storing device of the invention includes: a storing array, which includes a storing area with a plurality of storing elements and a redundancy storing area with a plurality of redundancy storing elements; a column selecting mean, adapted to select columns of the storing array; a redundancy information storing portion, adapted to store redundancy information of a defect element included in the storing elements of the storing area; a data retaining mean, connected to bit lines of the storing array, which is able to retain core data stored in the storing elements of the storing area of the column selected by the column selecting mean and the redundancy data stored in the redundancy storing elements of the redundancy storing area; a row selecting mean, adapted to select the core data and the redundancy data retained by the data retaining mean; and an error correction mean, adapted to correct the errors of the data selected by the row selecting mean. The row selecting means includes a transform circuit, and the transform circuit transforms the defect data included in the core data into the redundancy data according to the redundancy information, the transformed data is provided to the error correction mean, and the data corrected by the error correction mean is provided to the data retaining mean as the core data.

It is preferred that during a period in which the row selecting mean is outputting a first core data retained by the data retaining mean to an output buffer, a second core data and the redundancy data retained by the data retaining mean are outputted to the transform circuit. It is preferred that during a period in which the first core data is outputted to the output buffer, the data corrected by the error correction mean is retained in the data retaining mean as the second core data. It is preferred that the row selecting mean can output the first core data and the second core data alternately to the output buffer, during a period in which the first core data is outputted to the output buffer, the second core data and the redundancy data are being transformed by the transform circuit, and during a period in which the second core data is outputted to the output buffer, the first core data and the redundancy data are being transformed by the transform circuit. It is preferred that the column selected by the column selecting mean is N bits, the redundancy storing area is M bits, the defect element included in the N-M bits storing elements of the storing area is compensated at most by the M bit redundancy storing elements. It is preferred that the data retaining mean includes: a first cache register and a second cache register, adapted to retain the first core data and the second core data of the page data read from the storing area when the column of the storing array is selected by the column selecting mean; and a redundancy cache register, adapted to retain the redundancy data read from the redundancy storing area when the column of the storing array is selected by the column selecting mean. The row selecting mean receives the core data retained in the first cache register and the redundancy data retained in the redundancy cache register or the core data retained in the second cache register and the redundancy data retained in the redundancy cache register. In addition, the row selecting mean also writes the data received from the error correction mean to the first cache register or the second cache register.

A redundancy method of the semiconductor storing device of the invention is the redundancy method of the semiconductor storing device including a storing array. The storing array includes a storing area with a plurality of storing elements and a redundancy storing area with a plurality of redundancy storing elements. The redundancy methods includes selecting a page of the storing array, retaining core data stored in the storing elements of the storing area and redundancy data stored in the redundancy storing elements of the redundancy storing area of a selected page, transforming the defect data comprised in a first core data by utilizing the redundancy data while the first core data is utilized as the core data, correcting the error of the transformed data, and overwriting the corrected data as the first core data.

It is preferred that during a period in which the defect data included in a second core data as the core data is being transformed by utilizing the redundancy data, the corrected first core data is outputted. It is preferred that during a period in which the corrected data is being overwritten as the second core data and the defect data included in the first core data as the core data is being transformed by utilizing the redundancy data, the corrected second core data is outputted.

According to the invention, as compared to the currently existing redundancy method, the method disclosed in the invention allows the increase in efficiency of the compensation which utilizes the redundancy storing elements, and at the same time, improves the yield rate.

BRIEF DESCRIPTION OF THE DRAWINGS

FIG. 7(A) and FIG. 7(B) are diagrams illustrating a redundancy of a cache register CR-0 and an operation of error correction and FIG. 7(C) and FIG. 7(D) are diagrams illustrating a redundancy of a cache register CR-1 and an operation of error correction.

FIG. 9(A) is a timing diagram illustrating an operation of reading a page and FIG. 9(B) is a timing diagram illustrating a continuous operation of reading a page.

DESCRIPTION OF THE EMBODIMENTS

Next, the detailed descriptions accompanied by figures according to embodiments of the invention will be presented below. The invention is applicable to nonvolatile memories having various types of storing scheme. Herein, NAND flash memory is utilized as an example for a preferred embodiment. In addition, it is worth to note that parts of the accompanied figures are exaggerated to emphasize on certain features to make it more apparent for understanding, and the proportion thereof is different from the real devices.

Figure 1:
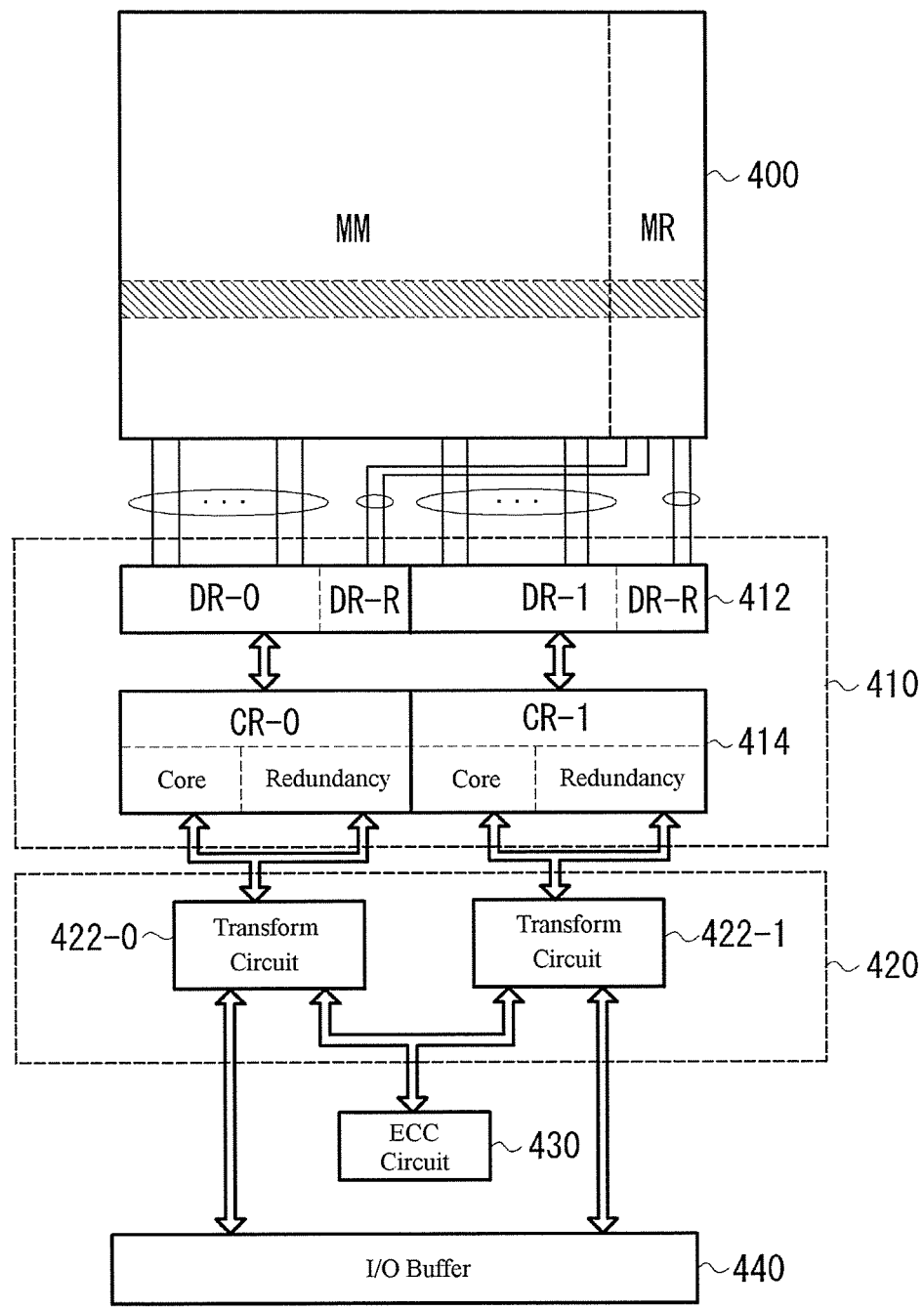
FIG. 1 is a schematic diagram illustrating a redundancy of a flash memory and the operation of error correction.
Figure 2:
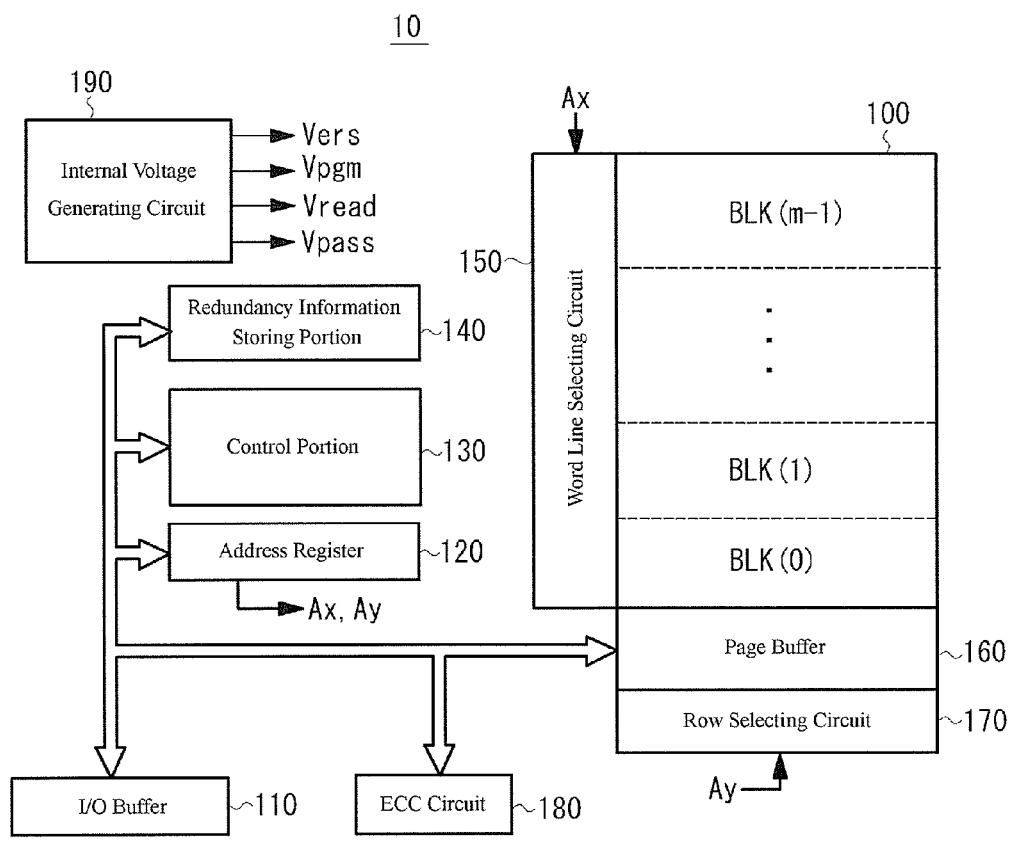
FIG. 2 is a block diagram of a NAND flash memory according to an embodiment of the invention.

FIG. 2 is a schematic diagram illustrating typical scheme of a flash memory according to an embodiment of the invention. However, the flash memory presented herein is only an example for explanation, and the scheme of the invention is not limited herein. The flash memory 10 according to the present embodiment includes: a storing array 100, formed by a plurality of memory cells arranged in matrix; an I/O buffer 110, connected to an external I/O terminal, adapted to retain input and output data; an address register 120, adapted to receive address data from the I/O buffer 110; a control portion 130, adapted to receive command data from the I/O buffer 110 or control signals coming from external, thereby controlling each part of the flash memory; a redundancy information storing portion 140, adapted to store redundancy information related to a defect element included in the storing array 100; a word line selecting circuit 150 which receives column address information Ax from the address register 120, decodes the column address information Ax, and selects block and word line, etc. according to the decoding results; a page buffer 160, adapted to retain the data read from the page selected by the word line selecting circuit 150 or retain the data to be written in the page selected; a row selecting circuit 170 which receives row address information Ay from the address register 120, decodes the row address information Ay, and selects the data in the page buffer 160 according to the decoding results; an ECC circuit 180, adapted to correct the errors in the data; and an internal voltage generating circuit 190, adapted to generate various voltages (writing voltage Vpgm, passing voltage Vpass, pass reading voltage Vread, erasing voltage Vers, etc.) required for data reading, programming, and erasing. In addition, storing elements of the storing array can be a Single-Level Cell (SLC) type which stores one bit (binary data). The storing elements of the storing array can also be Multi-Level Cell (MLC) type which stores multiple bits.

Figure 3:
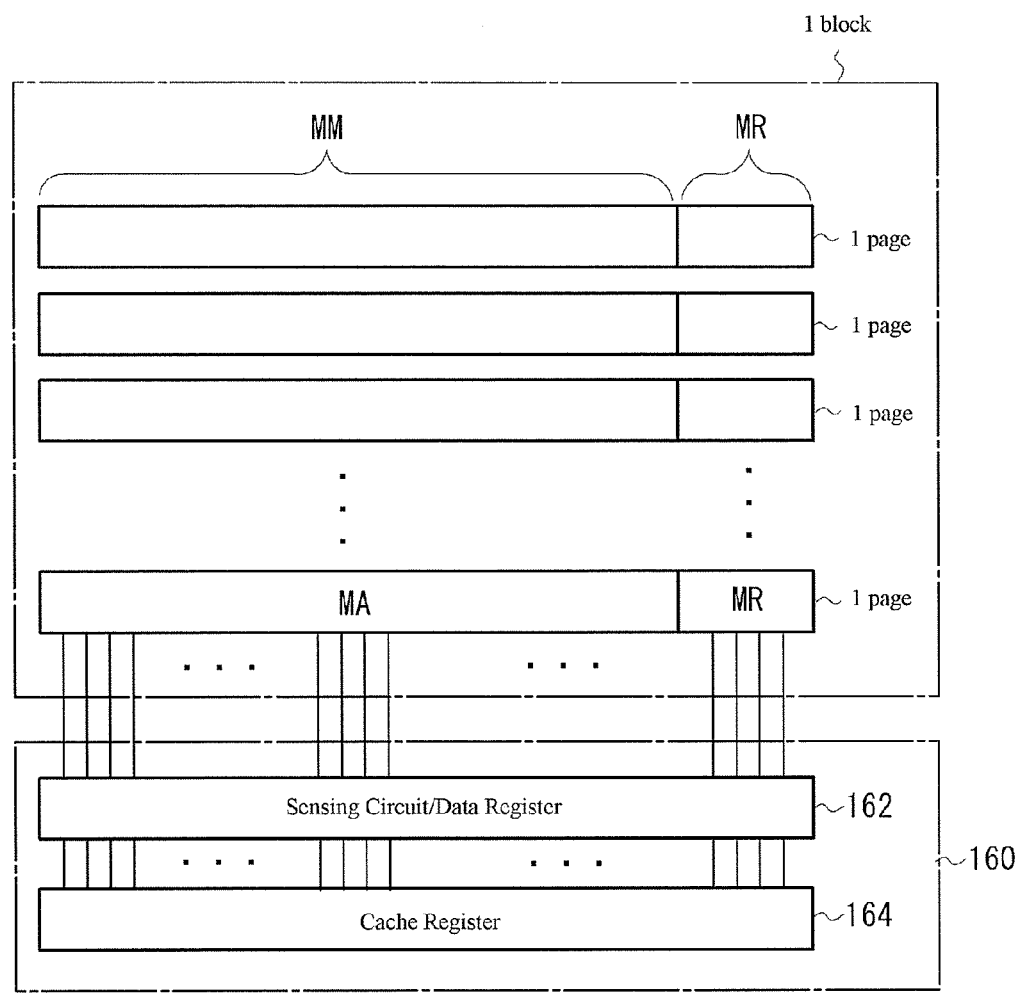
FIG. 3 is a schematic diagram illustrating a relationship between a memory block and a page buffer.

The storing array 100 includes m memory blocks BLK (0), BLK (1), . . . , BLK (m−1) arranged along row direction. FIG. 3 is a schematic diagram illustrating the scheme of the array in a memory block. In the flash memory, the memory block is the unit which erases data, and the memory block includes a plurality of pages. One page is a unit which performs data reading/writing, and one page includes a plurality of memory cells arranged along the same column of the NAND string described below. In addition, as for functionality, a memory block is divided into a storing area MM configured to perform data writing/reading and a redundancy storing area MR. Herein, a page includes memory cells of the storing area MM and the redundancy storing area MR. For example, a page includes 2000 bytes, and the redundancy data is 16 bits. However, the reading/writing based on page as a unit is not limited to one page, and a plurality of pages can be read or written as well.

The page buffer 160 includes a sensing circuit/data register 162 and a cache register 164. The sensing circuit/data register 162 is connected to each of the bit lines of each of the blocks. The sensing circuit/data register 162 senses the data read by the selected page of the selected block, and such data is retained in the sensing circuit/data register 162. The sensing circuit/data register 162 connects to a cache register 164 through a transmission transistor (not illustrated). The data retained in the sensing circuit/data register 162 is being parallel transmitted to the cache register 164 through the transmission transistor. If the data transmission from the sensing circuit/data register 162 to the cache register 164 ends, the data of the page being read is transmitted to the sensing circuit/data register 162 subsequently. During this period, the data retained by the cache register 164 is outputted to the ECC circuit 180 or the I/O buffer 110.

During the writing (programming) operation, the data outputted from the I/O buffer 110 is inputted and retained in the cache register 164 in sequence. Subsequently, the data is transmitted to the sensing circuit/data register 162 by the transmission transistor. After writing the data retained in the sensing circuit/data register 162 to the selected page of the selected blocks, the next data is being transmitted to the sensing circuit/data register 162 from the cache register 164.

Figures 4, 5:
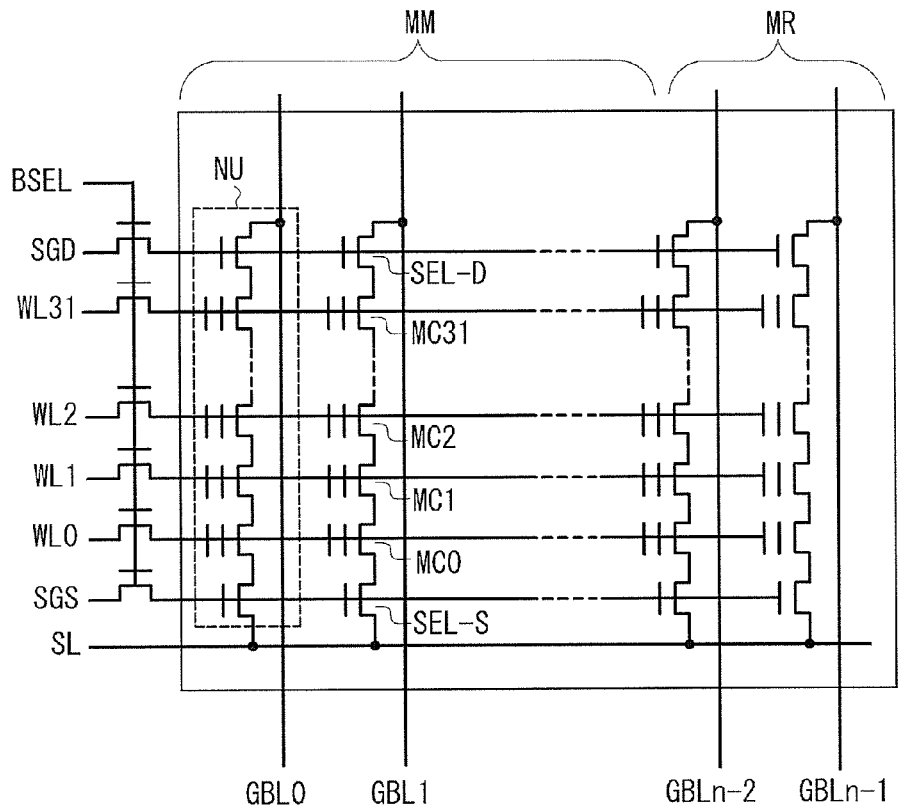
FIG. 4 is a schematic diagram illustrating a scheme of NAND string units.
FIG. 5 is a diagram illustrating an example of redundancy information stored in a redundancy information storing portion.

FIG. 4 is a schematic diagram illustrating a scheme of NAND string formed in a memory block. A memory block includes a NAND string (hereinafter cell unit NU) formed by a plurality of memory cells connecting in series, and each of the cell units NU arranges along column direction. The plurality of cell units NU arranges along column direction are formed inside a well such as P type well on a substrate to form a memory block. In the embodiment, a memory block includes n bits of cell units NU, and specified bits are utilized in the main storing area MM which is adapted for reading/writing general core data. The rest of the bits are allocated to the redundancy storing area MR.

A cell unit NU is configured to include N memory cells MCi (i=0, 1, . . . , N−1) connected in series and a source select transistor SEL-S and a drain select transistor SEL-D which connects to two terminals of the aforementioned N memory cells MCi in series. Herein, the cell unit NU includes 32 memory cells.

The gate of each of the memory cells MCi is connected to the corresponding word line WL0~WL31. Similarly, the source select transistor SEL-S and the drain select transistor SEL-D also respectively jointly connected to a source select line SGS and a drain select line SGD. The drain of the source select transistor SEL-S is connected to the source of the memory cell MC0, the source of the source select transistor SEL-S is connected to a common source line SL, and the gate of the source select transistor SEL-S is connected to the source select line SGS. The source of the drain select transistor SEL-D is connected to the drain of the memory cell MC 31, the drain of the drain select transistor SEL-D is connected to a corresponding global bit line GBL, and the gate of the drain select transistor SEL-D is connected to the drain select line SGD. The word lines WL0~WL31, the source select line SGS, and the drain select line SGD are connected to the word line selecting circuit 150 through a block selecting transistor which inputs a block select line BSEL into the common gate. The word line selecting circuit 150 utilizes the block select line BSEL to allow the block selecting transistor to conduct according to the column address Ax, thereby to perform the selection of the block. Moreover, the word line selecting circuit 150 utilizes a predetermined voltage to drive the word lines WL0~WL31, the source select line SGS, and the drain select line SGD in the selected block based on operation conditions.

The memory cells MCi, the source select transistor SEL-S, and the drain select transistor SEL-D formed within the blocks are formed on a N type metal oxide semiconductor transistor formed in the P type well. The memory cell includes: a source/drain of a N-type diffusion region; a tunnel oxide film formed on the channel between the source and the drain; a floating gate (charge storing layer) formed on the tunnel oxide film and adapted to store charges; and a control gate, which is formed on the floating gate with a dielectric film therebetween.

In a preferable embodiment, the global bit lines GBL0, GBL1, ...., GBLn−1 which connects to the cell units NU are connected to the page buffer 160 thorough a bit line selecting circuit. During the reading or programming period, the bit line selecting circuit selects even bit lines or odd bit lines and connects the even or odd bit lines to the page buffer 160. If a sensing circuit is shared by a pair of even bit line and odd bit line, and the even bit line and the odd bit line respectively form a page, then the sensing circuit includes sensing circuit of one page amount. During the reading period, the sensing circuit/data register 162 detects the electric potential of the even bit line or odd bit line and retains the data being read; and during the programming period, it retains the data which is to be written to the even bit line or the odd bit line. The row selecting circuit 170 selects bit line according to row address information Ay and writes data to the selected bit line, or alternatively, reads data from the selected bit line. The row selecting circuit 170 further includes a transform circuit 172. The transform circuit 172 transforms a defect bit containing defect element into a redundancy bit containing redundancy element by the following method.

In order to compensate for the defect elements including physical defects (short circuit, opening circuit, etc.) generated during the manufacturing steps by using redundancy element, the redundancy information is stored in the redundancy information storing portion 140. FIG. 5 is a diagram illustrating an example of redundancy information stored in a redundancy information storing portion 140. As the information of defect elements, the memory block and row address containing defect element and the relationship of the row address of the redundancy element which is allocated to compensate for the defect element are stored herein. In addition, if necessary, the column address of the defect element can also be included, and the compensation is performed when the column address (page) is selected. The redundancy information is generated by performing tests on the defect elements before the product is dispatched from the factory. The redundancy information storing portion 140 is, for example, fuse ROM or other nonvolatile memories.

Figure 6:
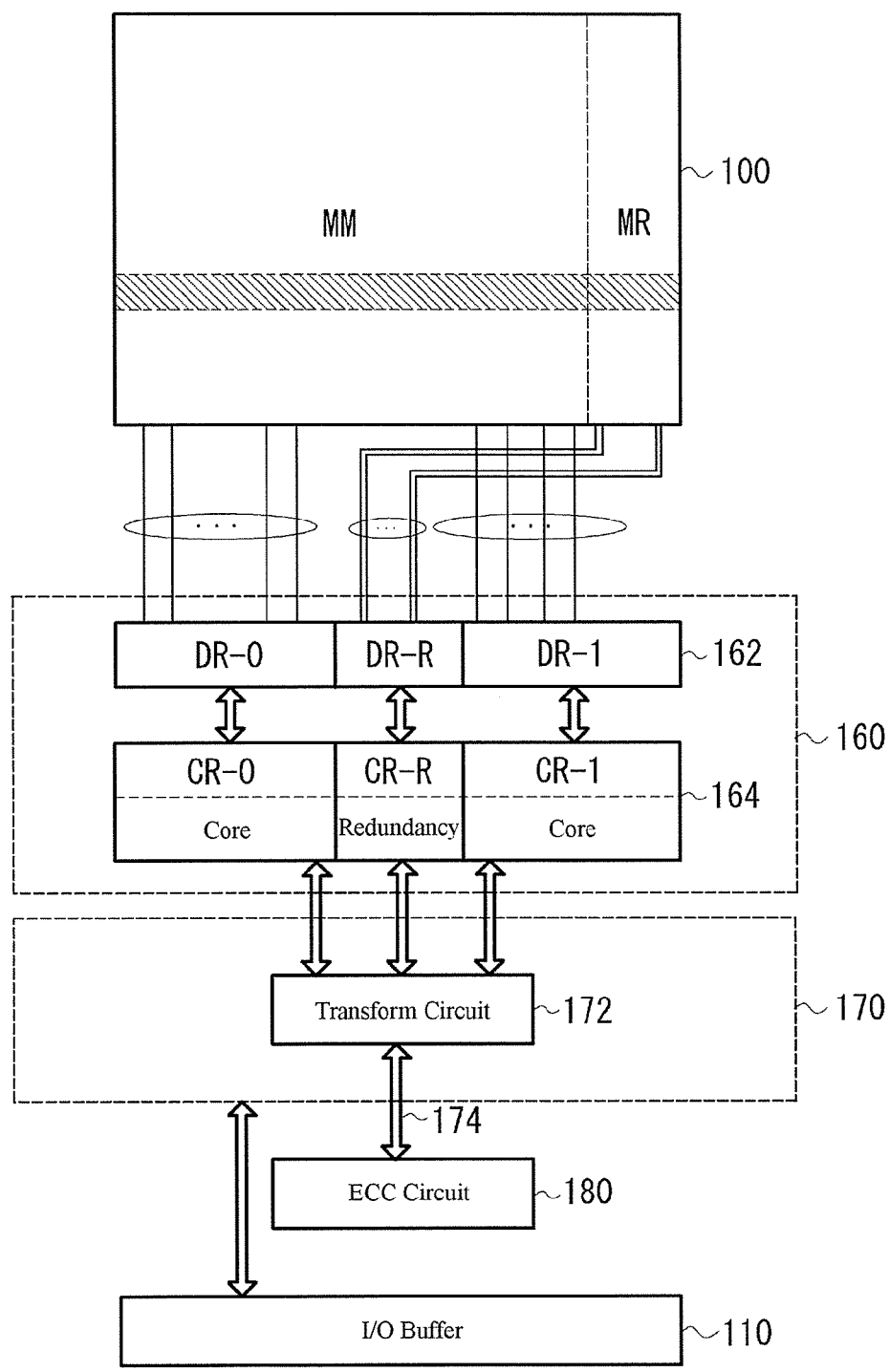
FIG. 6 is a schematic diagram illustrating a redundancy of a NAND flash memory and an operation of error correction according to an embodiment of the invention.

Next, the explanation of the redundancy of the flash memory and the error correction of the present embodiment will be presented below. FIG. 6 is a block diagram illustrating internal scheme of the page buffer 160 and the row selecting circuit 170. The sensing circuit/data register 162 includes data registers DR-0 and DR-1 which retains the core data read (or write) from the storing area MM and a redundancy data register DR-R which retains the redundancy data read (or write) from the redundancy storing area MR. The data registers DR-0 and DR-1 retains ½ pages of data of the selected page. For example, a page is 2000 bytes, and the redundancy bits number is 16 bits.

The cache register 164 includes cache registers CR-0, CR-1 and redundancy cache register CR-R. The cache registers CR-0, CR-1, and CR-R respectively receives data parallel transmitted from the data registers DR-0, DR-1, and DR-R through the transmit transistor (not illustrated). The cache registers CR-0, CR-1, and CR-R also retain each of the data received.

The row selecting circuit 170 includes the transform circuit 172. The transform circuit 172 replaces the defect data of the defect element included in the core data of the data of the cache registers CR-0, CR-1 with redundancy data of the redundancy element. Herein, it is worth to note that in the currently existing redundancy method, ½ page of the core data of the cache register CR-0 can be compensated at most by M/2 bit redundancy data, and ½ page of the core data of the cache register CR-1 can be compensated at most by M/2 bit redundancy data. On the contrary, in the present embodiment, an entire page of the core data of the cache registers CR-0, CR-1 can be compensated at most by M bit redundancy data. Therefore, in the currently existing redundancy, even under the circumstances such that the defect element included in one page is less than M bits, if defect element greater than M/2 is exist in the cache register CR-0/CR-1, the defect elements cannot be compensated. As a result, the flash memory would be a disqualified product. However, in the present embodiment, even under such circumstance, the defect element can still be compensated, thereby allowing the flash memory to be a qualified product.

The transform circuit 172 is connected to the ECC circuit 180 through a bidirectional bus 174. The transform circuit 172 can provide core data or the data compensated by the redundancy data to the ECC circuit 180.

FIG. 7(A) to FIG. 7(D) are diagrams illustrating redundancy operation of the present embodiment in detail. The transform circuit 172 is shared by the two cache registers CR-0 and CR-1. The transform circuit 172 transforms defect data into redundancy data according to the redundancy information stored in the redundancy information storing portion 140 while outputting the data retained in the cache registers CR-1, CR-1 to the ECC circuit 180.

FIG. 7(A) illustrates the operation of outputting the data of the cache register CR-0 to the ECC circuit 180. When performing error correction on the data of the cache register CR-0, the core data of the cache register CR-0 and the redundancy data of the redundancy cache register CR-R are transmitted to the transform circuit 172 through the transmission transistor (not illustrated). Upon receiving the defect data containing defect element in the core data, the transform circuit 172 replaces the defect data with the redundancy data while retaining the replaced data. In addition, the transform circuit 172 outputs the core data or the data compensated by the redundancy data to the ECC circuit 180.

If error correction by the ECC circuit 180 is completed, then as shown in FIG. 7(B), the transform circuit 172 would receive corrected data outputted by the ECC circuit 180. The transform circuit 172 overwrites the corrected data as the core data to the cache register CR-0. Herein, it is worth to note that the corrected data is not separated into the original core data and the redundancy data by the transform circuit 172, and the overwriting of the redundancy data in the redundancy register CR-R is not performed. FIG. 7(C) and FIG. 7(D) are diagrams illustrating the error correction operation of the redundancy of the data retained in the cache register CR-1. Under such condition, the defect data included in the core data of the cache register CR-1 is also transformed by utilizing the redundancy data of the redundancy element. After performing error correction by the ECC circuit 180, corrected data is being overwritten only to the cache register CR-1 as the core data, and the redundancy data is not overwrite to the redundancy cache register CR-R.

Figure 8A:
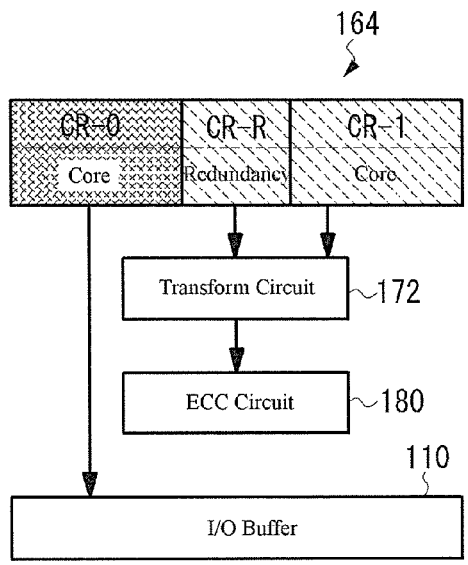
FIG. 8(A) and FIG. 8(B) are diagrams illustrating an operation of outputting data from the cache register CR-0 and FIG. 8 (C) and FIG. 8 (D) are diagrams illustrating an operation of outputting data from the cache register CR-1.
Figure 8B:
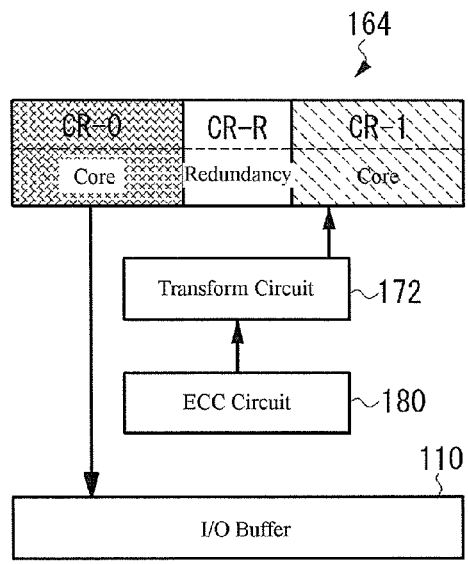
Figure 8C:
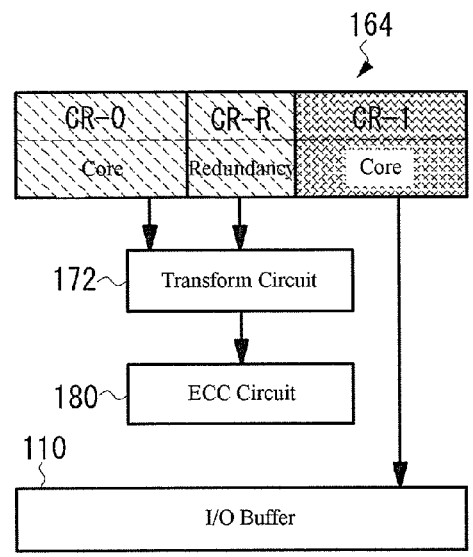
Figure 8D:
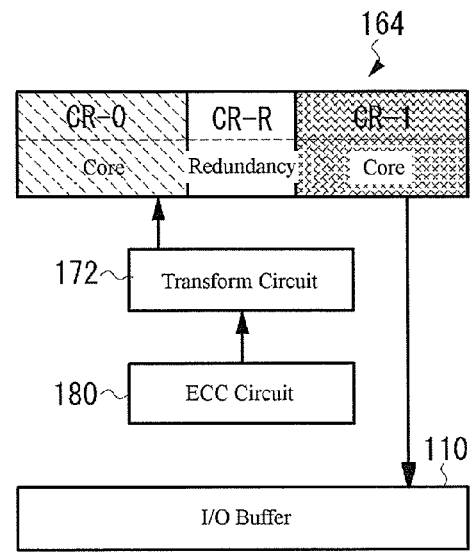

FIG. 8(A) to FIG. 8(D) are diagrams illustrating an operation of outputting data retained in the cache register. As shown in FIG. 8(A) and FIG. 8(D), during a period in which the corrected core data retained in the cache register CR-0 is outputted, the core data of the cache register CR-1 can be compensated by utilizing redundancy data while the ECC circuit 180 is being utilized to conduct error correction. Moreover, as shown in FIG. 8(C) and FIG. 8(D), during a period in which the corrected core data retained in the cache register CR-1 is outputted, the core data of the cache register CR-0 can be compensated by utilizing redundancy data while the ECC circuit 180 is being utilized to conduct error correction. As such, when outputting data from the cache registers CR-0 and CR-1, the redundancy cache register CR-R is not utilized. Therefore, the redundancy cache register CR-R can be used solely for redundancy. FIG. 9(A) is a timing diagram illustrating an operation of reading a page and FIG. 9(B) is a timing diagram illustrating a continuous operation of reading a page.

Figure 10A:
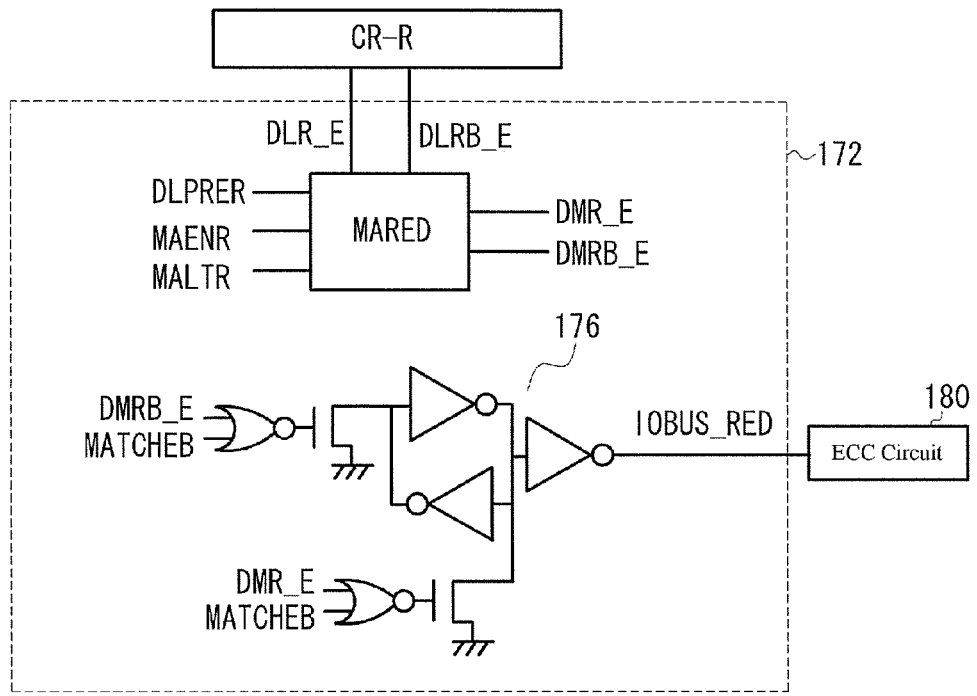
FIG. 10(A) and FIG. 10(B) are diagrams illustrating an example of a transform circuit according to an embodiment of the invention.
Figure 10B:
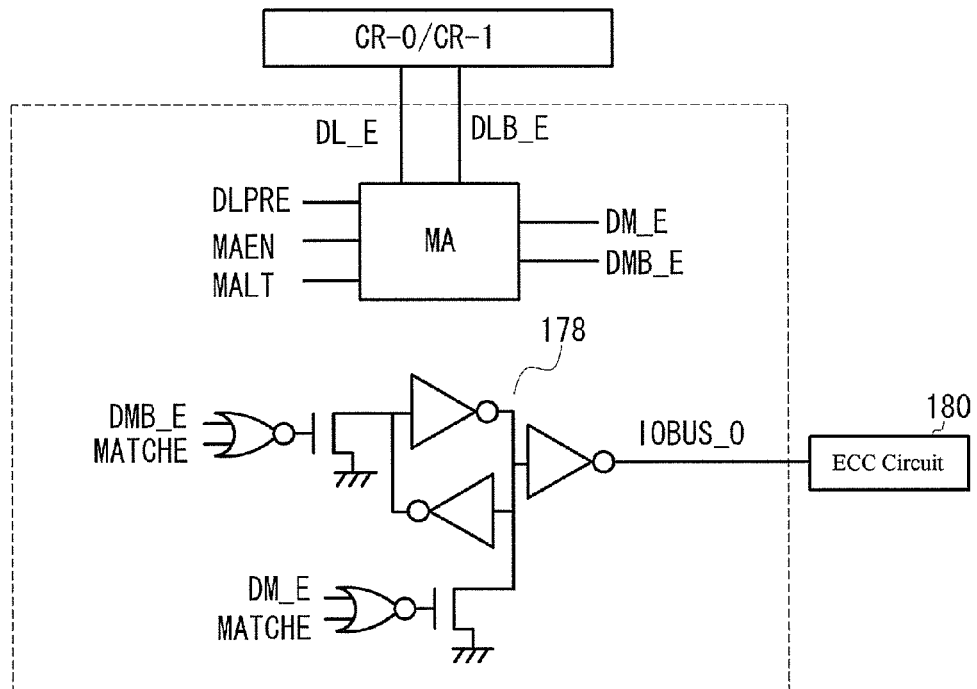

Subsequently, a specific embodiment of the transform circuit is being explained below. FIG. 10(A) and FIG. 10(B) are diagrams illustrating the internal scheme of the transform circuit 172. Herein, only representative 1 bit circuit scheme is illustrated. As shown in FIG. 10(A), the transform circuit 172 includes a redundancy main amplifier MARED and a redundancy logic circuit 176. The internal of the redundancy main amplifier MARED includes a latch circuit, and the redundancy main amplifier MARED is being inputted with control signals of a pre-charge signal DLPRE, an enable signal MAENR, and a latch control signal MALTR and the redundancy data DLR_E, DLRB_E coming from the redundancy cache register CR-R. The redundancy main amplifier MARED controls the outputs DMR_E, DMRB_E of the redundancy data according to the control signals. That is, when the latch control signal MALTR is L, the output DMR_E becomes L, when control signal MALTR is H, the output DMR_R becomes H. The "B" in the figure is defined as the signal after reverse logic state.

The outputs DMR_E/DMRB_E of the redundancy main amplifier MARED is inputted into the logic circuit 176. Herein, MATCH is the signal which becomes H when the defect bits of the defect element included in the core data matches (identical to) the redundancy bit of the redundancy element. Therefore, when the row addresses of the two bits of the redundancy information are identical, MATCH would become H, and MATCHB would become L. As such, two or NOR gate would become active, and corresponding to the output DMR_E, the two N channel MOS transistor would complementarily connect or disconnect, the data corresponding to the redundancy data DLR_E, DLRB_E would be retained in the latch circuit, and the data obtained by reversing the aforementioned data would be outputted from IOBUS_RED. The IOBUS_RED is connected to the ECC circuit 180.

On the other hand, if the two row addresses do not match, then MATCHB would become H, and the two transistors would disconnect. IOBUS_RED would reach a high impedance state, so the redundancy data is not outputted to the ECC circuit 180. As such, when the row address of the defect element is identical to the row address of the redundancy element (MATCH=H, MATCHB=L), the logic circuit 176 would respond to the latch control signal MALTR and outputs the redundancy data to IOBUS_RED.

The row selecting circuit 170 further includes a core data main amplifier MA and a logic circuit 178 as shown in FIG. 10(B). The main amplifier MA receives the core data DL_E, DLB_E retained in the cache registers CR-0 and CR-1. The main amplifier MA controls the outputs DM_E, DMB_E according to the control signals of the pre-charge signal DLPRE, the enable signal MAENR, and the latch control signal MALTR. The basic operation of the main amplifier MA is the same as the redundancy main amplifier MARED.

When the row address of the defect element and the row address of the redundancy element are not identical, MATCH would become L, and the NOR gate of the logic circuit 178 would become active, the latch circuit would retain data corresponding to core data DL_E, DLB_E, and the data obtained by reversing the aforementioned data would be outputted from IOBUS_0. The IOBUS_0 is connected to the ECC circuit 180. On the other hand, when the two row addresses are identical, MATCH would become H, thereby the two transistors would disconnect, and IOBUS_0 would reach a high impedance state, so the core data is not outputted to the ECC circuit 180. As such, when the row address of the defect element is identical with the row address of the redundancy element (MATCH=H, MATCHB=L), the logic circuit 178 would respond to the latch control signal MALTR and output the core data to IOBUS_0.

Moreover, as shown in FIG. 7(B) and FIG. 7(D), the corrected data is being overwritten to the cache register CR-0, CR-1 by the transform circuit 172. Under such condition, the data outputted from the ECC circuit 180 is being written to the cache register CR-0, CR-1 by the main amplifier MA.

The embodiment illustrates the example of reading operation, and under the condition in which the data is being edited, the written data received by the I/O buffer 110 is separated into the redundancy data and the core data by the transform circuit 172 and are respectively transmitted to the cache registers CR-0, CR-1, and CR-R.

The preferable embodiment of the invention had been described in detail above, but the invention is not limited to a specific embodiment. It will be apparent to those skilled in the art that various modifications and variations can be made to the structure of the present invention without departing from the scope or spirit of the invention.

What is claimed is:

1. A semiconductor storing device comprising:
    a storing array comprises a storing area with a plurality of storing elements and a redundancy storing area with a plurality of redundancy storing elements;
    means for column selecting, configured to select columns of the storing array;
    a redundancy information storing portion, configured to store redundancy information of a defect element comprised in the storing elements of the storing area;
    means for data retaining, connected to bit lines of the storing array, which is able to retain core data stored in the storing elements of the storing area of the column selected by the means for column selecting and redundancy data stored in the redundancy storing elements of the redundancy storing area;

means for row selecting, configured to select the core data and the redundancy data retained by the means for data retaining; and means for error correction, configured to correct errors of the data selected by the means for row selecting, wherein the means for row selecting comprises a transform circuit, and the transform circuit transforms the defect data comprised in the core data into the redundancy data according to the redundancy information, the transformed data is provided to the means for error correction, and the data corrected by the means for error correction is provided to the means for data retaining as the core data.

2. The semiconductor storing device according to claim 1, wherein during a period in which the means for row selecting is outputting a first core data retained by the means for data retaining to an output buffer, a second core data and the redundancy data retained by the means for data retaining are outputted to the transform circuit.

3. The semiconductor storing device according to claim 2, wherein during a period in which the first core data is outputted to the output buffer, the data corrected by the means for error correction is retained in the means for data retaining as the second core data.

4. The semiconductor storing device according to claim 1, wherein the means for row selecting is able to output the first core data and the second core data alternately to the output buffer, during a period in which a first core data is outputted to the output buffer, a second core data and the redundancy data are being transformed by the transform circuit, and during a period in which the second core data is outputted to the output buffer, the first core data and the redundancy data are being transformed by the transform circuit.

5. The semiconductor storing device according to any claim 1, wherein the column selected by the means for column selecting is N bits, the redundancy storing area is M bits, and the defect element comprised in the N-M bits storing elements of the storing area is compensated at most by the M bit redundancy storing elements.

6. The semiconductor storing device according to claim 1, wherein the means for data retaining comprises:

a first cache register and a second cache register, configured to retain a first core data and a second core data of the page data read from the storing area when the column of the storing array is selected by the means for column selecting; and a redundancy cache register, configured to retain the redundancy data read from the redundancy storing area when the column of the storing array is selected by the means for column selecting, wherein the means for row selecting receives the core data retained in the first cache register and the redundancy data retained in the redundancy cache register or the core data retained in the second cache register and the redundancy data retained in the redundancy cache register and writes the data received from the means for error correction to the first cache register or the second cache register.

7. A redundancy method, which comprises a semiconductor storing device comprising a storing array, wherein the storing array comprises a storing area with a plurality of storing elements and a redundancy storing area with a plurality of redundancy storing elements, and the redundancy method comprising:

selecting a page of the storing array;

retaining core data stored in the storing elements of the storing area and redundancy data stored in the redundancy storing elements of the redundancy storing area of a selected page;

transforming the defect data comprised in a first core data by utilizing the redundancy data, wherein the first core data is utilized as the core data;

correcting the error of the transformed data; and overwriting the corrected data as the first core data.

8. The redundancy method according to claim 7, wherein during a period in which the defect data comprised in a second core data as the core data is being transformed by utilizing the redundancy data, the corrected first core data is outputted.

9. The redundancy method according to claim 8, wherein during a period in which the corrected data is being overwritten as the second core data and the defect data comprised in the first core data as the core data is being transformed by utilizing the redundancy data, the corrected second core data is outputted.

* * * * *